United States Patent
Kita

(10) Patent No.: US 8,867,220 B2
(45) Date of Patent: Oct. 21, 2014

(54) PACKAGING BOARD WITH VISUAL RECOGNITION WINDOWS

(75) Inventor: Yukinori Kita, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 220 days.

(21) Appl. No.: 13/209,062

(22) Filed: Aug. 12, 2011

(65) Prior Publication Data

US 2012/0145436 A1 Jun. 14, 2012

(30) Foreign Application Priority Data

Dec. 14, 2010 (JP) ................. 2010-278454

(51) Int. Cl.
- *H05K 1/00* (2006.01)
- *H05K 1/02* (2006.01)
- *H05K 3/30* (2006.01)
- *H05K 3/34* (2006.01)

(52) U.S. Cl.
CPC ...... *H05K 3/306* (2013.01); *H05K 2201/10757* (2013.01); *H05K 2201/10303* (2013.01); *H05K 2201/10424* (2013.01); *H05K 2201/10295* (2013.01); *H05K 43/0256* (2013.01); *H05K 3/3447* (2013.01); *H05K 2201/10818* (2013.01)
USPC ........... 361/752; 361/803; 361/807; 361/809; 439/76.2

(58) Field of Classification Search
CPC ............... H01R 43/0256; H05K 2201/10295; H05K 2201/10303; H05K 2201/10757; H05K 2201/10962; H05K 2201/10424; H05K 2201/10818; H05K 3/306
USPC ............ 361/752, 803, 807, 809; 439/76.2
See application file for complete search history.

(56) References Cited

U.S. PATENT DOCUMENTS

| | | | | |
|---|---|---|---|---|
| 5,249,973 | A * | 10/1993 | Fujita et al. .................. | 439/76.2 |
| 6,891,463 | B2 | 5/2005 | Nagaoka | |
| 6,942,499 | B2 | 9/2005 | Tanaka et al. | |
| 7,112,071 | B2 * | 9/2006 | Nakagawa et al. ............. | 439/82 |
| 7,371,081 | B2 * | 5/2008 | Sano ............................ | 439/76.2 |
| 2002/0122296 | A1 * | 9/2002 | Stone et al. ................... | 361/687 |

FOREIGN PATENT DOCUMENTS

| | | |
|---|---|---|
| JP | A 10-125417 | 5/1998 |
| JP | A 2001-230555 | 8/2001 |
| JP | A 2002-270263 | 9/2002 |
| JP | A 2003-217347 | 7/2003 |
| JP | A 2009-225562 | 10/2009 |

* cited by examiner

*Primary Examiner* — Anatoly Vortman
*Assistant Examiner* — Jacob Crum
(74) *Attorney, Agent, or Firm* — Oliff PLC

(57) ABSTRACT

A packaging board of the type having board terminals soldered on a printed board and including an insulation support member made of a resin disposed on a printed board having tubular support portions configured to receive board terminals, visual recognition windows configured for visually recognizing soldering portions of the board terminals inserted into the printed board through the windows, and engaging portions that engage the board terminals and define insertion amounts of the board terminals.

14 Claims, 9 Drawing Sheets

PACKAGING BOARD WITH VISUAL RECOGNITION WINDOWS

CROSS-REFERENCE TO RELATED APPLICATION

This application claims priority to JP 2010-278454 filed in Japan on Dec. 14, 2010, the entire disclosure of which is hereby incorporated by reference herein.

BACKGROUND

Exemplary embodiments of this disclosure relate to a packaging board in which board terminals are soldered on a printed board.

Heretofore, a packaging board has been used as an internal circuit in an electrical junction box for a motor vehicle or the like. The packaging board has been a structure in which board terminals to be connected to electrical components such as fuses, connectors, and the like soldered on a printed board, as disclosed in, for example, JP 2003-217437 A.

SUMMARY

In many cases, a plurality of board terminals may be soldered on the printed board. Since it takes great time and effort to individually insert the board terminals into through holes in the printed board, a plurality of board terminals may be inserted into a jig that temporarily fixes the board terminals for insertion together through holes in the printed board. After insertion, the board terminals may then be soldered on the printed board.

However, because such structure requires a jig in compliance with a packaging board, this can result in increased cost and complexity in production. In particular, it is inefficient to prepare a jig for an application involving only a few board terminals.

In such an application, it may be possible to provide a pedestal to hold the few board terminals together for insertion through the printed board. The use of a pedestal, however, requires free space around the pedestal in order to provide access to the soldering portions of the board terminals, which can reduce the density of the printed board.

Accordingly, in an exemplary, embodiment, a packaging board is provided herein configured to solder board terminals on a printed board without requiring a jig, without visually obstructing the soldering portions of the board terminals, and while achieving a high board terminal density.

In an exemplary embodiment, a packaging board may include board terminals soldered on a printed board. In the packaging board, an insulation support member made of a resin may be disposed on a printed board. The insulation support member may be provided with tubular support portions having visual recognition windows, wherein the tubular support portions receive the board terminals. The tubular support portions may be provided with engaging portions that engage the board terminals to control the amount of insertion of the board terminals. Soldering portions of the board terminals inserted into the printed board can thus be recognized visually through the visual recognition windows.

According to the exemplary embodiment of the packaging board, when the board terminals are soldered on the printed board, the board terminals can be inserted into the tubular support portions on the insulation support member, and the engaging portions in the tubular support portions may lock the board terminals. Thus, the board terminals can be supported on the insulation support member. The insulation support member can support the plurality of board terminals, and the board terminals can be inserted into and soldered in the through-holes in the printed board. Thus, a jig is not needed. Since the insulation support member can be made of a resin, the insulation support member can be easily produced and works in compliance with a circuit configuration, in contrast to a metal jig, thereby lowering production costs. Since the insulation support member can be separated from the board terminals, it is possible to produce the insulation support member with a low cost, in comparison with an insert-molding process. In particular, in applications including a small number of board terminals to be soldered on a printed board, excellent efficiency and low cost can be achieved in some aspects, in comparison with preparing a jig or the like. Furthermore, the use of a jig requires that the jig be removed from the printed board after attaching the board terminals to the printed board. In contrast, with the packaging board provided herein, it may not be necessary to remove the insulation support member from the printed board after attaching the board terminals to the printed board, thereby reducing the number of soldering steps.

Furthermore, the insulation support member may be provided with visual recognition windows. Thus, the soldering portions of the board terminals can be recognized through the visual recognition windows. Thus, visual inspection of the soldering portions can be achieved. Because the visual recognition of the soldering portions can be achieved through the visual recognition windows, it may not be necessary to obtain a space around the insulation support member, and thus it is possible to arrange other electrical components near the insulation support member, thereby increasing the density on the printed board.

According to another aspect, the tubular support portions may extend toward the printed board. Each of the tubular support portions may be provided with a recess in an end at a side of the printed board. The soldering portions of each of the board terminals may be exposed through the recess.

According to another aspect, in a case where any pressing force may be applied to the insulation support member at a side of the printed board by direct or indirect contact of the electrical components to be connected to the board terminals, the insulation support member can be supported by the tubular support portions because the tubular support portions make contact with the printed board. Thus, it is possible to prevent the insulation support member from being deformed and to reduce an inclination of the board terminals due to the deformation of the insulation support member. Although the insulation support member may contact the printed board, the insulation support member may contact the printed board when the insulation support member is pushed onto the printed board. Since the recess can be provided in each tubular support portion, visual recognition of the soldering portions of the board terminals can be obtained even though the tubular support portion extends to the printed board.

According to yet another aspect, a support member that supports a conductive member different from the board terminals on the printed board may constitute the insulation support member.

According to another aspect, the conductive member may be a member that can flow a current, for example, a board terminal or the like to be connected to a bus bar, a connector, or a fuse, for example. The support member that supports the conductive member may be an insulation plate that supports the bus bar or a resin-made pedestal that supports the board terminals. Since the insulation support member can be used as the support member that supports the conductive member, any jig may be used without increasing part count. Consequently, it may be possible to further decrease costs. For example, in the case where an insulation plate that supports the bus bar is used as the insulation support plate, since the insulation support member is disposed above the soldering portions of the board terminals inserted into the tubular support portions, the bus bar can be disposed above the soldering portions, thereby further enhancing a high density on the printed board.

According to another aspect, the tubular support portions formed on the insulation support member may be made of a resin, the board terminals may be inserted into the tubular support portions, and the engaging portions in the tubular support portions may define insertion amounts of the board terminals. The visual recognition windows may be formed in the insulation support member and the soldering portions of the board terminals can be visually recognized through the visual recognition windows. Thus, the board terminals can be inserted into the tubular support portions and can be supported by the insulation support member. When the board terminals are soldered on the printed board, it is possible to temporarily secure the plurality of board terminals to the printed board without requiring a jig. Consequently, it is possible to lower production costs. In contrast to a board in which the jig is required to be removed from the printed board after soldering, the insulation support member can remain on the printed board after soldering. Accordingly, it is possible to reduce the number of soldering steps. Furthermore, because the soldering portions can be visually recognized through the visual recognition windows, it may not be necessary to provide a space for visual recognition around the soldering portions. Since the electrical components can be arranged near the insulation support member, density on the printed board can be increased.

DETAILED DESCRIPTION OF EMBODIMENTS

Figure 1:
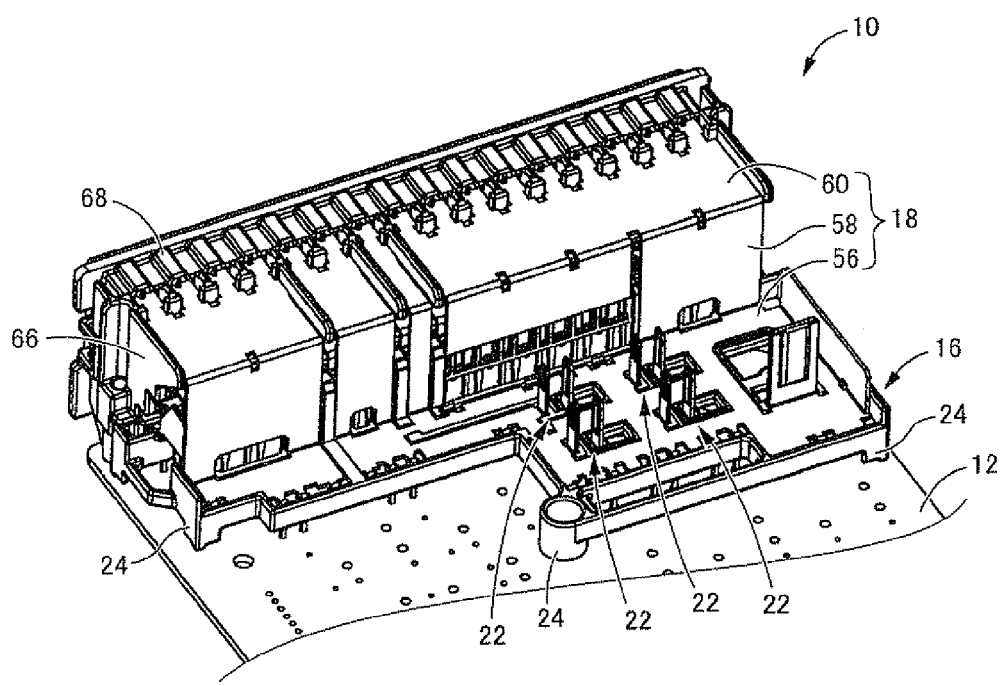
FIG. 1 is a perspective view of a main part of a packaging board in accordance with an exemplary embodiment of the present disclosure.

Referring now to the drawings, exemplary embodiments of a packaging board are described below.

Figure 2:
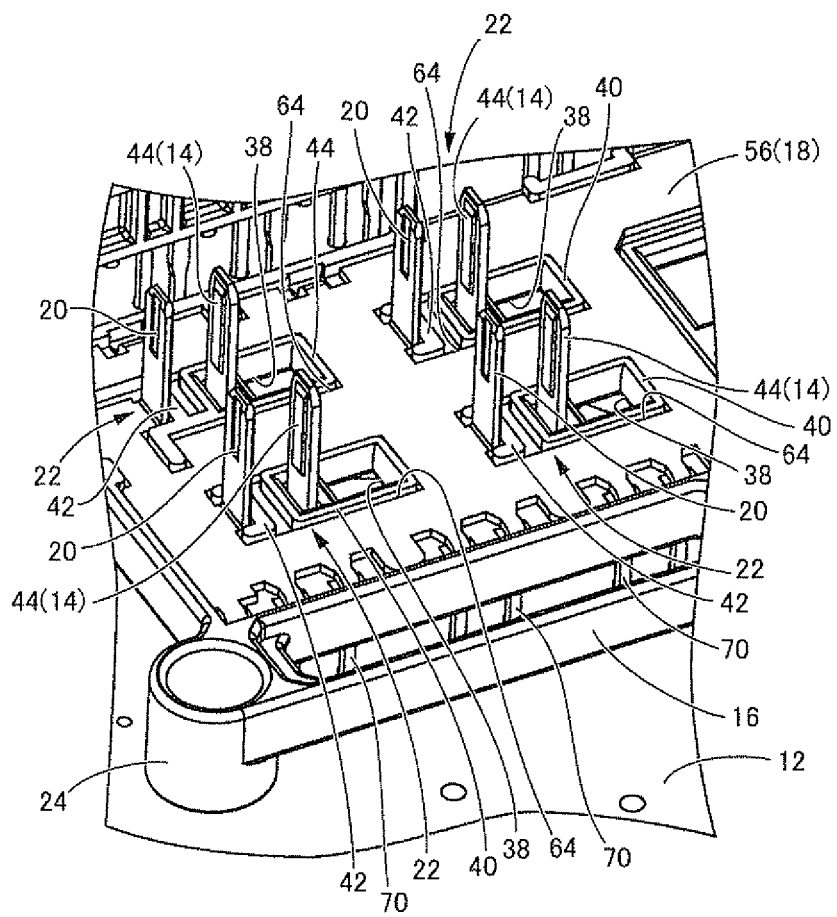
FIG. 2 is an enlarged perspective view of the main part shown in FIG. 1.

FIG. 1 shows a main part of a packaging board 10. FIG. 2 shows an enlarged perspective view of the main part in FIG. 1. The packaging board 10 is contained in a casing of an electrical junction box or a so-called junction box to be mounted on a motor vehicle or the like to constitute an internal circuit. The packaging board 10 includes a printed board 12 and a plurality of board terminals 14 projecting from the printed board 12. The board terminals 14 are inserted into an insulation plate 16 that is disposed on the printed board 12 to serve as a support member. The board terminals 14 are opposed to terminals 20 provided on a bus bar 18 that is disposed on the insulation plate 16 to serve as a conductive member. The board terminals 14 and the terminals 20 may constitute a plurality of fusible links.

Figure 3:
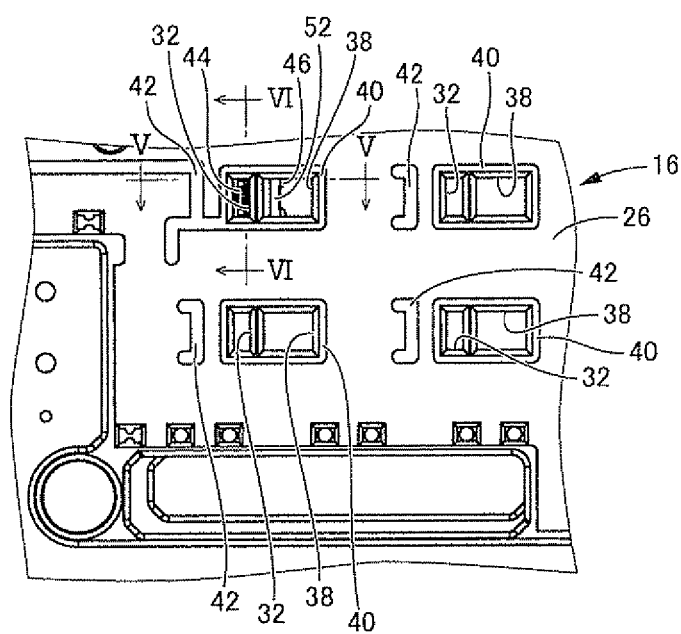
FIG. 3 is a plan view of a main part of an insulation plate shown in FIG. 1.
Figure 4:
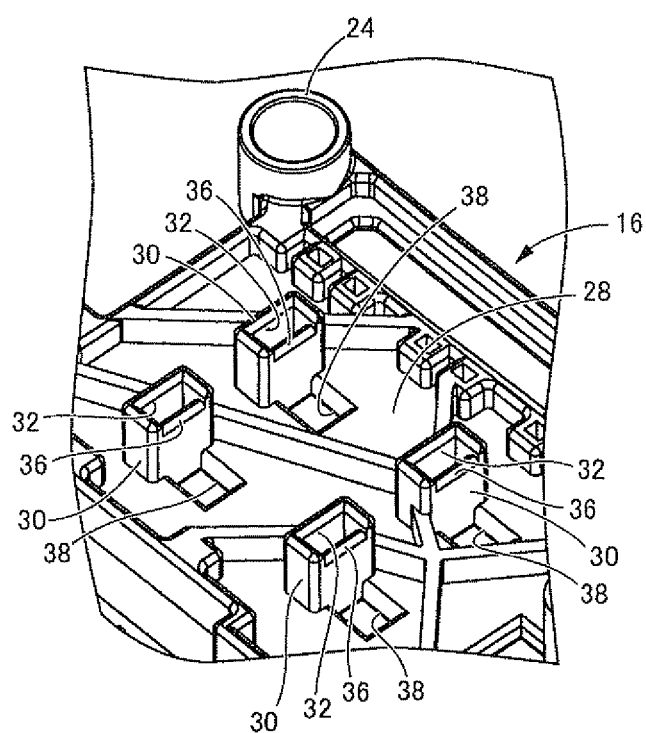
FIG. 4 is a perspective view of the main part of the insulation plate shown in FIG. 3, illustrating a rear side of the insulation plate.

FIG. 3 shows a main part of a front side 26 of the insulation plate 16. FIG. 4 shows a main part of a rear side of the insulation plate 16. In FIG. 3, a single board terminal 14 is inserted into a terminal-receiving hole 32 (e.g., an upper left terminal-receiving hole 32 in FIG. 3) in a single tubular support portion 30 (discussed below). The insulation plate 16 is formed into a substantially plate-like configuration made of a nonconductive synthetic resin, and is disposed on the printed board 12 through leg portions 24 projecting from suitable positions on the printed board 12. A bus bar 18 (see, for example, FIG. 1) may be disposed on the insulation plate 16.

Figure 5:
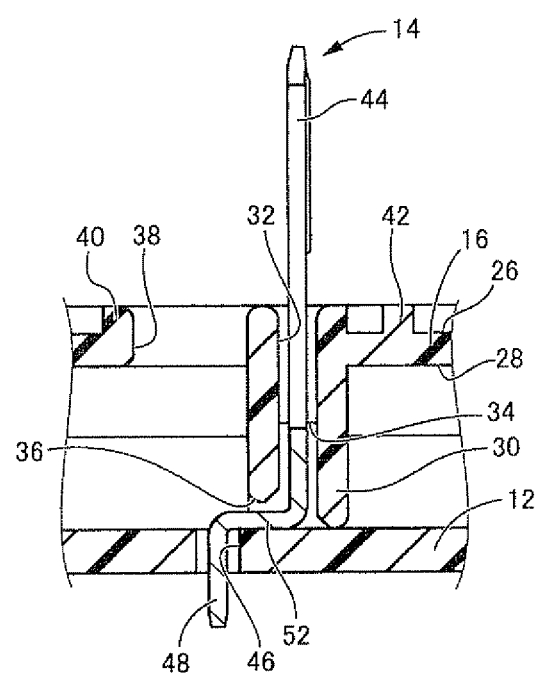
FIG. 5 is a section view of the insulation plate taken along lines V-V in FIG. 3.
Figure 6:
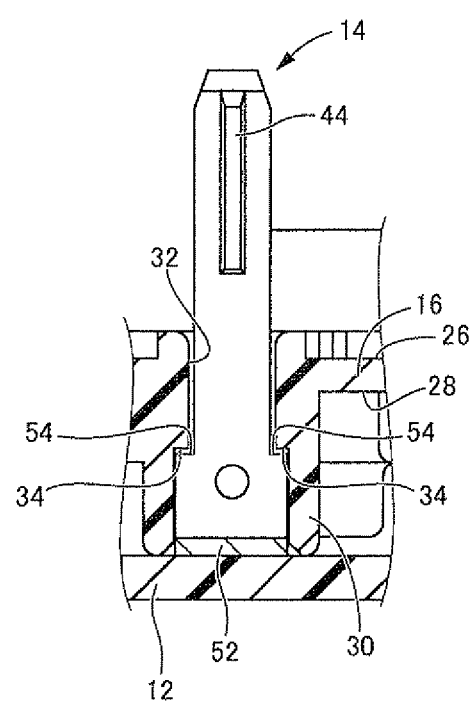
FIG. 6 is a section view of the insulation plate taken along lines VI-VI in FIG. 3.

A plurality of tubular support portions 30 (e.g., four portions 30) are integrated with a rear side of the insulation plate 16. As shown in FIGS. 5 and 6, each of the tubular support portions 30 may be formed into a substantially longitudinal rectangular tubular configuration that projects from the rear side 28 to the printed board 12. A dimension of the support tubular portion projecting from the rear side 28 may be set to be substantially equal to a dimension of the leg portion 24 projecting from the rear side 28. An internal space in the tubular support portion 30 may define a terminal-receiving hole 32 that penetrates the insulation plate 16. The terminal-receiving hole 32 may be formed into a through-hole having a substantially rectangular shape in cross section. As shown in FIG. 5, a width dimension of the terminal-receiving hole 32 in its short side direction (i.e., right and left directions in FIG. 5) may be substantially constant in a depth direction (i.e., upper and lower directions in FIG. 5) of the hole 32. On the other hand, as shown in FIG. 6, the terminal-receiving hole 32 may be provided on an intermediate part in a longitudinal direction (i.e., upper and lower directions in FIG. 6) with engaging portions 34, 34 that define stepped surfaces. A width dimension of the terminal-receiving hole 32 in a long side direction (i.e., right and left directions in FIG. 6) may be set so that the dimension at a side of the printed board 12 is greater than that at a side of the engaging portions 34, 34, thus defining a stepped configuration. It is apparent from FIG. 5 that a width dimension in a short side direction of the terminal-receiving hole 32 may be greater than a dimension in thickness of the board terminal 14. It is apparent from FIG. 6 that a width dimension in the long side direction of the terminal-receiving hole 32 may be set to be slightly greater than a width dimension of the board terminal 14.

Each tubular support portion 30 is provided with a recess 36 (see FIG. 4) in a distal end projecting from the rear side of the insulation plate 16. In an exemplary embodiment, the recess 36 is provided in one of long side portions of the tubular support portion 30 having a substantially rectangular shape. An amount of the long side portion that may be provided with the recess 36 that projects from the rear side 28 may be set to be slightly smaller than amounts of the other three side portions that project from the rear side 28. The tubular support portion 30 may be provided on each distal end projecting from the rear side 28 with a tapered shape in which an opening size becomes gradually greater toward a projecting end edge (see, for example, FIGS. 5 and 6). The tapered shape may serve to guide the board terminal 14 into the terminal-receiving hole 32 so that the board terminal 14 can be readily inserted into the hole 32.

The insulation plate 16 may be provided with visual recognition windows 38 (see, for example, FIGS. 3 and 4) that may be disposed adjacent the respective tubular support portions 30. Each visual recognition window 38 may be formed into a substantially rectangular shape that may have substantially the same dimension in a short side portion as the dimension in the long side portion (i.e., upper and lower directions in FIG. 3) of the terminal-receiving hole 32. The visual recognition window 38 may penetrate the insulation plate 16. The visual recognition window 38 may be disposed adjacent the tubular support portion 30 at the side provided with the recess 36.

The insulation plate 16 may be provided on its front side 26 with an outer peripheral projection 40 (see, for example, FIGS. 2 and 3) that may be formed into a rectangular frame-like configuration to surround outer peripheral edges of the terminal-receiving hole 32 and visual recognition window 38 together and projects slightly outward from the front side 26. Thus, the opening end side edges of the terminal-receiving hole 32 and visual recognition window 38 at the front side 26 may be disposed on slightly upper positions (i.e., upper positions in FIG. 5) than the front side 26. The outer peripheral projection 40 can serve to prevent a short circuit between the bus bar 18 and the board terminal 14 inserted into the terminal-receiving hole 32.

The insulation plate 16 may be provided on its front side 26 with positioning projections 42 near the terminal-receiving holes 32. Each positioning projection 42 may be disposed on a side opposite from the visual recognition window 38 across the terminal-receiving hole 32. Each positioning projection 42 may project from the front side 26 by the same projecting dimension as the outer peripheral projection 40. The positioning projection 42 may include at least a U-shaped portion in a plan view (see, for example, FIG. 3) that may be open in a direction opposite from the terminal-receiving hole 32. The specific configuration of the positioning projection 42 can be set suitably in consideration of a shape or the like of the bus bar 18. For example, the positioning projection 42 may be connected to the outer peripheral projection 40, if necessary, as is the case with the positioning projection 42 shown at an upper left position in FIG. 3.

The board terminals 14 may be inserted into the through-holes 32 in the insulation plate 16. As shown also in FIGS. 5 and 6, each board terminal 14 may be formed by punching a metal sheet or by cutting off a flat metal wire in a given length. The board terminal 14 may be provided on one end with a rectangular connecting portion 44 having a flat in cross section. The board terminal 14 may be provided on the other end with a pair of soldering portions 48 (only one soldering portion 48 is shown in FIG. 5) that are inserted into and soldered in each through-hole 46 in the printed board 12.

Each board terminal 14 may be formed into a crank-like configuration and may have a bent portion 52 bent in a crank-like shape between the connecting portion 44 and the soldering portions 48. Furthermore, the board terminal 14 may be provided between the bent portion 52 and the connecting portion 44 with stepped engaging projections 54, 54 projecting from both sides in a width direction (i.e., right and left directions in FIG. 6) of the board terminal 14. The board terminal 14 may have a small width dimension (i.e., dimension in right and left directions in FIG. 6) from the engaging projections 54, 54 to the connecting portion 44.

In the board terminal 14 constructed above, the soldering portions 48 may be inserted into and soldered in the through-hole 46 in the printed board 12 and may be inserted into the terminal-receiving hole 32 in the tubular support portion 30 on the insulation plate 16 so that the connecting portion 44 projects from the front side 26 on the insulation plate 16. When the board terminal 14 is inserted into the support tubular portion 30, the bent portion 52 of the board terminal 14 may project outward from the tubular support portion 30 through the recess 36 in the tubular support portion 30. The recess 36 may be disposed above (i.e., at an upper side in FIG. 5) the bent portion 52. The soldering portions 48 may be inserted into the through-hole 46 to be disposed outside the tubular support portion 30. Thus, the soldering portions 48 can be disposed below the visual recognition window 38. As shown in FIG. 6, the engaging projections 34, 34 of the tubular support portion 30 may be opposed to the engaging projections 54, 54 of the board terminal 14 so as to be spaced apart from the engaging projections 54, 54 by a slight clearance. Furthermore, the board terminal 14 may be inserted into the tubular support portion 30 so as to be spaced apart from the tubular support portion 30 by a suitable clearance in a thickness direction (i.e., right and left directions in FIG. 5) while the board terminal 14 may be inserted into the tubular support portion 30 without causing any clearance in a width direction (i.e., right and left directions in FIG. 6).

As shown in FIG. 1, the bus bar 18 may be disposed on the insulation plate 16. The bus bar 18 may be formed by punching out a metal sheet. The bus bar 18 may be formed into a crank-like configuration that includes a first flat plate portion 56, a vertical wall portion 58 standing up from the first flat plate portion 56, and a second flat plate portion 60 extending horizontally from the vertical wall portion 58. Although the bus bar 18 is not shown in detail in FIG. 1, the second flat plate portion 60 may be provided on its distal end edge with a plurality of so-called tuning fork-like terminals each having a pair of insulation displacement blades. Tuning fork-like terminals may be juxtaposed on the second flat plate portion 60. The tuning fork-like terminals can cooperate with the board terminals 14 soldered on the printed board 12 to define fuse-connecting sections.

A plurality of terminal portions 20 (e.g., four terminal portions shown in FIG. 2) may be integrated with the first plat plate portion 56. Each terminal portion 20 may be partially cut up from the first flat plate portion 56 to be formed into a flat tab-like configuration that has substantially the same size as the connecting portion 44 of the board terminal 14. The first flat plate portion 56 may be provided near each terminal portion 20 with a punched-out hole 64 (see, for example, FIG. 2) formed by a punching process to make the terminal portion 20.

Since the first flat plate portion 56 of the bus bar 18 may be disposed on the insulation plate 16 mounted on the printed board 12, the bus bar 18 may be supported above the printed board 12 by the insulation plate 16. Since the outer peripheral projection 40 of the insulation plate 16 may be fitted into the punched-out hole 64 when the first flat plate portion 56 is disposed on the insulation plate 16, the first flat plate portion 56 may be positioned on the insulation plate 16. Since the terminal portion 20 provided on the first flat plate portion 56 contacts with the positioning projection 42 on the insulation plate 16, the first flat plate portion 56 may be positioned on the insulation plate 16. In result, the connecting portion 20 of the bus bar 18 may be opposed to the connecting portion 44 of the board terminal 14, which projects upward from the insulation plate 16 through the terminal-receiving hole 32, to constitute a fusible link connecting portion 22.

In an exemplary embodiment, a process of assembling the above packaging board 10 can be carried out as follows. Firstly, the bus bar 18 may be disposed on the insulation plate 16. Although a detail illustration is omitted in FIG. 1, a fuse block 66 made of a synthetic resin and a side casing made of a synthetic resin that constitutes side surfaces of the electrical junction box are incorporated with the insulation plate 16. The second flat plate portion 60 of the bus bar 18 may be disposed on the fuse block 66. Since tuning fork-like terminal portions (not shown) provided on an end edge of the second flat plate portion 60 are inserted into the side casing 68, the bus bar 18 may be incorporated with the insulation plate 16 so that the bus bar 18 falls down from the insulation plate 16. When the bus bar 18 is incorporated with the insulation plate 16, soldering portions 70 (see, for example, FIG. 2) provided on the bus bar 18 can project from the rear side 28 of the insulation plate 16 via the through-holes in the insulation plate 16.

When the insulation plate 16, to which the bus bar 18 is attached, directs the rear side 28 upward in a vertical direction, the board terminals 14 can be inserted into the terminal-receiving holes 32 in the tubular support portions 30 from the rear side 28. When the engaging projections 54, 54 of each board terminal 14 contact with the engaging portion 34, 34 in each tubular support portion 30, an amount of inserting the board terminal 14 into the tubular support portion 30 can be defined and the board terminal 14 can be held in the insulation plate 16 under a condition where the soldering portions 48 project from the rear side 28.

Then, when the printed board 12 is superimposed onto the rear side 28 of the insulation plate 16 that holds the plural board terminals 14, the soldering portions 48 of the board terminals 14 projecting from the printed board 12 and the soldering portions 70 of the bus bar 18 can be inserted into the through-holes 46 in the printed board 12, respectively. Then, when the soldering portions 48 of the board terminals 14 inserted into the through-holes 46 and the soldering portions 70 of the bus bar 18 inserted into the through-holes 46 are soldered to the printed board 12, respectively, the board terminals 14 project from the printed board 12, and the board terminals 14 and bus bar 18 can be electrically connected to printed circuits (not shown) provided on the printed board 12. Thus, the packaging board 10 is constructed.

When the packaging board 10 constructed above is housed in the casing of the electrical junction box such as a junction box installed in, for example, a motor vehicle, the packaging board 10 can constitute an internal circuit for the electrical junction box. The terminal portions 20 of the bus bar 18 and the connecting portions 44 of the board terminals 14 that constitute the fusible link connecting portion 22 project outside the casing 12, so that the connecting portions 22 and 44 can be connected to the fusible link that serves as external electrical parts (not shown).

According to the packaging board 10 constructed above, when the soldering portions 48 of the board terminals 14 are inserted into the through-holes 46 in the printed board 12, it is possible to hold the board terminals 14 on the insulation plate 16 by inserting the board terminals 14 into the tubular support portions 30 integrated with the insulation board 16 and by engaging the board terminals 14 with the engaging projection 34 in the tubular support portions 30. Thus, when the board terminals 14 are soldered on the printed board 12, it is possible to temporarily secure the board terminals 14 to the printed board 12 without using any jig. Since the insulation plate 16 is made of a resin, the insulation plate 16 can be easily formed in comparison with a metal sheet and can deal with various kinds of arrangement of the board terminals flexibly and cheaply. Particularly, as described in the first embodiment, in the case where the number of board terminals 14 is relatively small, it is possible to obtain an excellent efficiency in cost in comparison with preparation for a metal jig.

In addition, in the first embodiment, since the insulation plate 16, on which the bus bar 18 is mounted, constitutes an insulation support member for the board terminals 14, it is possible to obtain excellent cost efficiency without increasing part count. Because it is not necessary to remove the insulation plate 16 from the printed board 12 after soldering the board terminals 14, it is possible to reduce the number of soldering steps. Furthermore, the bus bar 18 can be disposed through the insulation plate 16 above the soldering portions 48 of the board terminals 14, thereby realizing a high density on the printed board 12.

Since the insulation plate 16 is provided with the visual recognition windows 38, it is possible to visually recognize the soldering portions 48 of the board terminals 14 through the visual recognition windows 38. Thus, it is possible to easily carry out a visual detection of the soldering portions 48 of the board terminals 14. Since the soldering portions 48 can be recognized positively through the visual recognition windows 38, it may not be necessary to make additional spaces around the soldering portions 48 in order to obtain a visual recognition for the soldering portions 48, and other electrical components can be arranged near the soldering portions 48. Accordingly, it is possible to further achieve a high density on the printed board 12.

Since the board terminals 14 can be inserted into and surrounded by the tubular support portions 30, it is possible to restrain the board terminals 14 from being inclined when the fusible link is attached to and detached from the printed board 12, and it is possible to prevent the soldered portions from being cracked. Specifically, it is apparent from FIG. 6 that, in the case where a force is applied to the board terminal 14 in a drawing direction (i.e., upper direction in FIG. 6) when removing the fusible link from the fusible link connecting portion 22, the board terminal 14 can be prevented from moving upward since the board terminal 14 can be engaged with the engaging projections 34, 34 in the support tubular portion 34. Since the board terminal 14 can be inserted into the support tubular portion 30 without causing any clearance in the width direction (i.e., right and left directions in FIG. 6), it is possible to prevent the board terminal 14 from causing any backlash and play in the width direction of the terminal 14. In particular, it is apparent from FIG. 5 that the bent portion 52 of the board terminal 14 can be engaged with the recess 36 in the tubular support portion 30 against the drawing force and it is possible to restrain the board terminal 14 from moving upward.

Furthermore, the tubular support portions 30 can extend to the printed board 12, and the projecting end edges of the tubular support portions 30 can be positioned on the printed board without causing any clearance. Thus, for example, when the fusible link is connected to the board terminals 14, if a pressing force directed to the printed board 12 is applied to the insulation plate 16, the tubular support portions 30 contact the printed board 12 and a deformation of the insulation plate 16 and an inclination of the board terminal 14 due to the deformation of the insulation plate 16 can be restrained. Since the soldering portions 48 of the board terminal 14 are disposed outside the tubular support portion 30 through the recess 36 in the tubular support portion 30, the soldering portions 48 can be recognized visually even though the tubular support portion 30 extends to the printed board 12.

Figure 7:
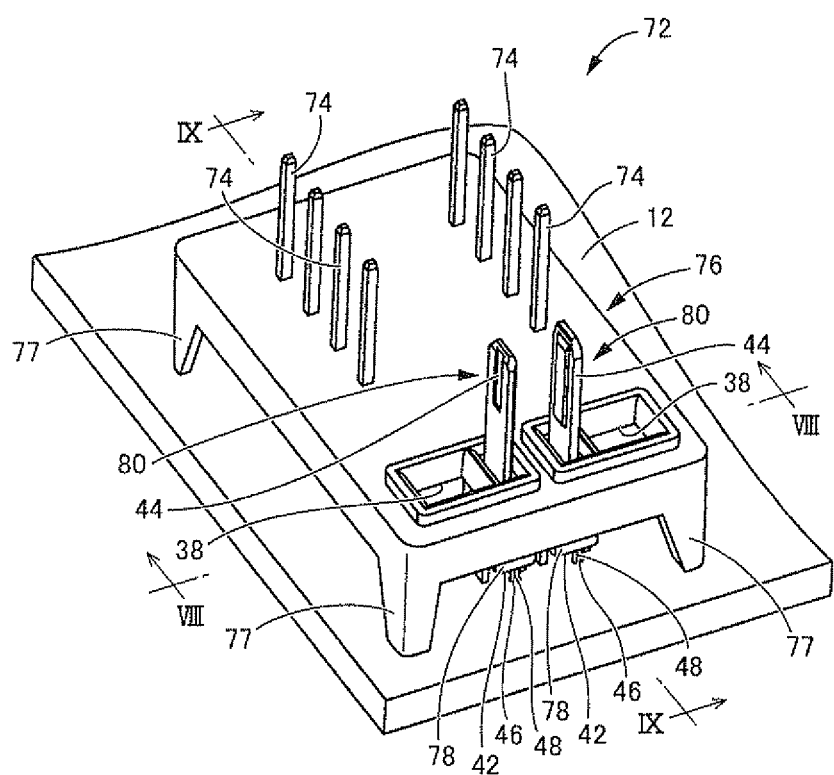
FIG. 7 is a perspective view of a main part of a packaging board in accordance with another exemplary embodiment of the present disclosure.

FIG. 7 shows another exemplary embodiment of a packaging board 72.

In this exemplary embodiment, a pedestal 76 can support a plurality of board terminals 74 that can serve as conductive members. The pedestal 76 can constitute an insulation support member. The pedestal 76 may be formed into a rectangular block-like configuration made of a nonconductive synthetic resin. The pedestal 76 may be disposed on the printed board 12 through leg portions 77 projecting from four corners of the pedestal 76. Each board terminal 74 may be formed by cutting a metal wire by a given length and has a substantially square shape in cross section. A plurality of board terminals 74 may be arranged and fixed on the pedestal 76 by a pressing process or an insert-forming process to be supported above the printed board 12. The one end of each board terminal 74 may be inserted into and soldered in a through-hole (not shown) in the printed board 12, while the other end of each board terminal 74 can be connected to a connector (not shown) that may serve as an external electrical component.

Figure 8:
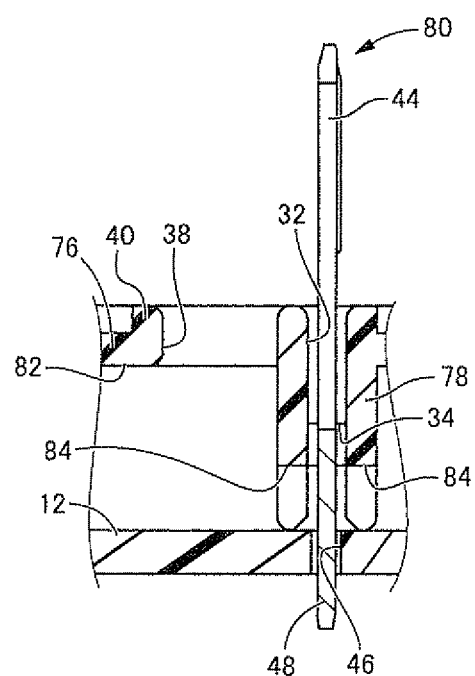
FIG. 8 is a section view of the packaging board taken along lines VIII-VIII in FIG. 7.
Figure 9:
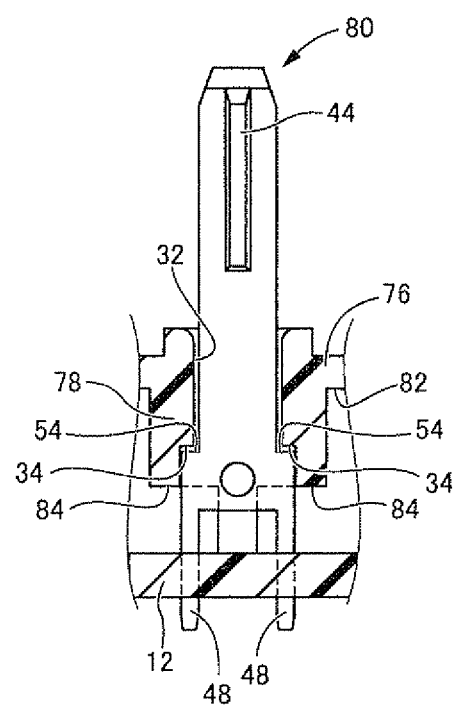
FIG. 9 is a section view of the packaging board taken along lines IX-IX in FIG. 7.

A pair of tubular support portions 78, 78 may be integrated with the pedestal 76. Each board terminal 80 may be inserted into each tubular support portion 78. As shown in FIGS. 8 and 9, the board terminal 80 may be formed straight and may not be provided with the bent portion 52 formed on the board terminal 14.

Each tubular support portion 78 may be formed into a substantially rectangular tubular configuration that extends straight from a rear side 82 of the pedestal 76 toward the printed board 12. The tubular support portion 78 may be provided on its opposite ends in a width direction (i.e., right and left directions in FIG. 8) with recesses 84, 84. Each tubular support portion 78 may be provided in its adjacent part with the visual recognition window 38 that penetrates the pedestal 76.

According to this embodiment, when the board terminal 80 is soldered on the printed board 12, the board terminal 80 can be inserted into the tubular support portion 78 of the pedestal 76 and the pedestal 76 can support the board terminal 80. When the soldering portions 48 of the pair of board terminals 80, 80 supported on the pedestal 76 are inserted into and soldered in the through-holes 46 in the printed board 12, the connecting portions 44, 44 of the pair of board terminals 80, 80 are opposed to each other on the pedestal 76. It is possible to visually recognize the soldering portions 48 of the board terminals 80 through the recesses 84 and visual recognition windows 38 provided in the tubular support portions 78.

It will be apparent from the above embodiment that a pedestal that supports the board terminals may be used as an insulation support member. The board terminal to be inserted into the tubular support portion may have a straight configuration. A specific configuration of the tubular support portion can be set in accordance with a specific configuration of the board terminal. For example, in the case where the board terminal 80 has a straight configuration, the soldering portions 48 can be disposed in the tubular support portion 78. Thus, the soldering portions 48 may be positioned in the tubular support portion 78 and may be exposed outside through the recesses 84 so as to be recognized at the outside. The soldering portions 48 are not required to be disposed outside the tubular support portion 78.

Although the embodiments of the present disclosure are described above in detail, it should be noted that the present disclosure is not limited to the above embodiments. In some aspects, the above embodiments can reduce a part count by utilizing the insulation plate 16 and the pedestal 76, which serve to support the bus bar 18 and the board terminals 74, as an insulation support member. However, it may not be necessary to replace an insulation member by a support member that supports the other conductive member. The insulation support member may be prepared separately. In such case, it is possible to lower production costs by eliminating the step of removing the insulation plate from the printed board, and to reduce a solder cracking, since the board terminal can be supported by the insulation support member after soldering.

The tubular support portion is not required to extend to the printed board to make contact with the printed board. The projecting end edge of the tubular support portion from the insulation member may be positioned to be spaced apart from the printed board by a given distance.

What is claimed is:

1. A packaging board of a type having board terminals soldered on a printed board, comprising:
    an insulation support member made of a resin disposed on a printed board, the insulation support member including:
    (i) tubular support portions that receive board terminals wherein the board terminals have a crank-like shape;
    (ii) visual recognition windows on a top surface of the insulation support member so that soldering portions of the board terminals are visually recognizable by looking through the top surface of the insulation support member when the board terminals are inserted into the printed board; and
    (iii) a plurality of engaging portions that each engage a portion of the board terminal that extends through the insulation support member such that each engaging portion directly interfaces with one of two opposite sides of the portion of the board terminal that extends through the insulation support member, the engaging portions defining insertion amounts of the board terminals.

2. A packaging board according to claim 1, wherein the tubular support portions extend in a direction toward the printed board.

3. A packaging board according to claim 1, wherein each of the tubular support portions is provided with a recess in an end at a side of the printed board.

4. A packaging board according to claim 3, wherein the soldering portion of each of the board terminals is exposed through each corresponding recess.

5. A packaging board according to claim 1, wherein the insulation support member supports a conductive member different from the board terminals on the printed circuit board.

6. A packaging board, comprising:
    a printed board;
    board terminals soldered on the printed board; and
    an insulation support member comprising a resin disposed on the printed board, the insulation support member including:
    tubular support portions receiving the board terminals, wherein the board terminals have a crank-like shape;
    visual recognition windows on a top surface of the insulation support member so that the soldering portions of the board terminals inserted into the printed board are visually recognizable by looking through the top surface of the insulation support member, and
    a plurality of engaging portions that each engage a portion of the board terminal that extends through the insulation support member such that each engaging portion directly interfaces with one of two opposite sides of the portion of the board terminal that extends through the insulation support member, the engaging portions defining insertion amounts of the board terminals.

7. A packaging board according to claim 6, wherein the tubular support portions extend in a direction toward the printed board.

8. A packaging board according to claim 6, wherein each of the tubular support portions is provided with a recess in an end at a side of the printed board.

9. A packaging board according to claim 8, wherein the soldering portion of each of the board terminals is exposed through each corresponding recess.

10. A packaging board according to claim 6, wherein the insulation support member supports a conductive member different from the board terminals on the printed circuit board.

11. A packaging board according to claim 1, wherein
the insulation support member includes a terminal receiving hole such that a single board terminal passes through the terminal receiving hole and two or more engaging portions are disposed within the terminal receiving hole.

12. A packaging board according to claim 6, wherein
the insulation support member includes a terminal receiving hole such that a single board terminal passes through the terminal receiving hole and two or more engaging portions are disposed within the terminal receiving hole.

13. A packaging board according to claim 1, wherein
the engaging portions are each stepped surfaces that interface with an engaging projection of the board terminal.

14. A packaging board according to claim 6, wherein
the engaging portions are each stepped surfaces that interface with an engaging projection of the board terminal.

\* \* \* \* \*